United States Patent
Jun et al.

(10) Patent No.: US 12,119,041 B2
(45) Date of Patent: Oct. 15, 2024

(54) SIGNAL SYNCHRONIZATION ADJUSTMENT METHOD AND SIGNAL SYNCHRONIZATION ADJUSTMENT CIRCUIT

(71) Applicant: Integrated Silicon Solution Inc., Milpitas, CA (US)

(72) Inventors: Sang Min Jun, Milpitas, CA (US); Kwang Kyung Lee, Milpitas, CA (US); Seung Cheol Bae, Milpitas, CA (US); Kang Min Lee, Milpitas, CA (US); Young Jin Yoon, Milpitas, CA (US); Sun Byeong Yoon, Milpitas, CA (US)

(73) Assignee: Integrated Silicon Solution Inc., Milpitas, CA (US)

( * ) Notice: Subject to any disclaimer, the term of this patent is extended or adjusted under 35 U.S.C. 154(b) by 183 days.

(21) Appl. No.: 18/093,817

(22) Filed: Jan. 6, 2023

(65) Prior Publication Data
US 2024/0233807 A1   Jul. 11, 2024

(51) Int. Cl.
*G11C 11/4076* (2006.01)
*G06F 3/06* (2006.01)
*G11C 11/4096* (2006.01)

(52) U.S. Cl.
CPC ........ *G11C 11/4076* (2013.01); *G06F 3/0604* (2013.01); *G06F 3/0655* (2013.01); *G06F 3/0673* (2013.01); *G11C 11/4096* (2013.01)

(58) Field of Classification Search
CPC .................. G11C 11/4096; G11C 11/4076
USPC ............................................ 365/194
See application file for complete search history.

(56) References Cited

U.S. PATENT DOCUMENTS

| | | | | |
|---|---|---|---|---|
| 6,215,726 B1* | 4/2001 | Kubo | ........ | G11C 7/1078 |
| | | | | 365/194 |
| 2008/0162857 A1* | 7/2008 | Oh | ........ | G11C 7/1069 |
| | | | | 711/170 |
| 2019/0065074 A1* | 2/2019 | Lee | ........ | G11C 5/04 |

* cited by examiner

*Primary Examiner* — Anthan Tran
(74) *Attorney, Agent, or Firm* — Lin & Associates Intellectual Property, Inc.

(57) ABSTRACT

The present invention relates to a signal synchronization adjustment method and a signal synchronization adjustment circuit, for applying to data reading according to a reference clock signal between a memory controller and a dynamic random access memory in an electronic device. First, the memory controller triggers a command signal to the dynamic random access memory; then, the dynamic random access memory delays for a column selection signal latency time according to a first rising edge of the reference clock signal, and then triggers a column selection signal; after that, the dynamic random access memory delays for an internal data strobe signal latency time, and then triggers an internal data strobe signal; finally, the dynamic random access memory delays for an external data strobe signal latency time, and then triggers an external data strobe signal. The signal synchronization adjustment circuit is applied to the signal synchronization adjustment method.

10 Claims, 12 Drawing Sheets

SIGNAL SYNCHRONIZATION ADJUSTMENT METHOD AND SIGNAL SYNCHRONIZATION ADJUSTMENT CIRCUIT

BACKGROUND OF THE INVENTION

1. Field of the Invention

The present invention relates to a signal synchronization adjustment method, and in particular, to a signal synchronization adjustment method and a signal synchronization adjustment circuit.

2. The Prior Arts

Synchronous dynamic random access memory (SDRAM) is a kind of volatile memory, which is characterized in that SDRAM is designed to be synchronized (synchronization, Sync) with the timing of the central processing unit, such that the memory controller can control the exact clock cycle required for preparing the requested data, therefore the central processing unit does not need to delay the next data access. Dual-channel SDRAM (Double data rate SDRAM, DDR SDRAM) is a new generation of SDRAM technology, the double data transmission rate of the dual-channel SDRAM refers to that it can be read or written twice in a single cycle. In the case of the same core clock, the transmission efficiency is twice that of SDRAM.

Under the technology of dual-channel SDRAM, data strobe signal (DQS) is an important technology, which is mainly used to accurately distinguish each transmission cycle in one clock cycle, such that the receiver can receive the information accurately. In addition, when the dual-channel SDRAM performs the read operation, the data strobe signal DQS and the written signal cannot immediately read the information in the memory, but there is a requirement for a period of time of delaying, therefore, the time cycle of delaying is defined as latency time of DQS relative to the read signal.

Generally, the system memory itself does not have a clock generator, while the clock is generated and provided by the memory controller to the system memory, such that the access operation can be completed according to the instructions of the clock signal. As mentioned above, in most system memories, when a read command is performed, a read latency (tRL) is bound to be generated, and the read latency must be synchronized with the clock to ensure stable execution of the read operation. However, under the condition in some system memories that the data strobe signal DQS is not synchronized with the clock, the timing of the data strobe signal DQS and the clock will be set to be asynchronous. If the data strobe signal DQS is merely generated by simply delaying for a time, there may be a risk that the dual-channel SDRAM cannot stably execute the read operation at various frequencies.

Therefore, the present invention is completed by the inventor in view of the above-mentioned problems.

SUMMARY OF THE INVENTION

An object of the present invention is to provide a signal synchronization adjustment method, for applying to data reading according to a reference clock signal between a memory controller and a dynamic random access memory in an electronic device, in the signal synchronization adjustment method, the dynamic random access memory is used to delay for a column selection signal latency time according to a first rising edge of the reference clock signal, and then trigger the column selection signal; in addition, after delaying for the column selection signal latency time, the dynamic random access memory further delays for an internal data strobe signal latency time and triggers an internal data strobe signal; such that the column selection signal and the internal data strobe signal are synchronized (synchronization, Sync) with the reference clock signal, thereby the dynamic random access memory can stably execute the read operation by the synchronized column selection signal and internal data strobe signal.

Another object of the present invention is to provide a signal synchronization adjustment circuit, wherein both the internal data strobe signal delay circuit and the external data strobe signal delay circuit can be generated and implemented by using serially connected logic gate(s) (e.g., NAND gate(s)) and inverter(s). Therefore, since both the internal data strobe signal delay circuit and the external data strobe signal delay circuit of the present invention are only composed of inverter(s) and resistor(s), the power consumption can be greatly reduced, the space occupied by the delay circuits can be reduced at the same time, and effects such as low power consumption and wide applicability can be achieved.

Yet another object of the present invention is to provide different signal synchronization adjustment methods and signal synchronization adjustment circuits. When the dynamic random access memory is in the low frequency mode, the dynamic random access memory of the present invention can: determine the dynamic random access being in the low frequency mode according to the reference clock signal; delay for a first low frequency latency time, and then trigger the column selection signal according to the second rising edge of the reference clock, such that the column selection signal is synchronized with the reference clock signal; and delay for a second low frequency latency time, and then trigger the internal data strobe signal. When the dynamic random access memory is in the high frequency mode, the dynamic random access memory of the present invention can determine that the dynamic random access memory being in the high frequency mode according to the reference clock signal, and delay for a first high frequency latency time and then further delay for a second high frequency latency time, so as to correct the first column selection data of the column selection signal by the reference clock signal. Therefore, the column selection signal and the internal data strobe signal can be achieved to be synchronized with the reference clock signal at various frequencies, which ensures that the dynamic random access memory can stably execute the read operation at various frequencies.

In order to achieve the above object, the present invention provides a signal synchronization adjustment method, for applying to data reading according to a reference clock signal between a memory controller and a dynamic random access memory in an electronic device, wherein a cycle of the reference clock signal is one time cycle, the method comprises: a controlling step that the memory controller triggers a command signal to the dynamic random access memory, the command signal includes a first command, a second command, a third command and a fourth command, and the memory controller stops controlling the dynamic random access memory; a column selection signal triggering step that after the third command is generated, the dynamic random access memory delays for a column selection signal latency time according to a first rising edge of the reference clock, and then triggers a column selection signal; an internal data strobe signal triggering step that the dynamic random access memory delays for an internal data strobe signal latency time, and then triggers an internal data strobe signal; an external data strobe signal triggering step that the dynamic random access memory delays for an external data strobe signal latency time, and then triggers an external data strobe signal.

Preferably, according to the signal synchronization adjustment method of the present invention, when the dynamic random access memory is in a low frequency mode, a time length of a first column selection data of the column selection signal is four times of a length of the time cycle, and when the dynamic random access memory is in a high frequency mode, the time length of the first column selection data of the column selection signal ranges between three and four times of the length of the time cycle.

Preferably, according to the signal synchronization adjustment method of the present invention, a sum of time that the column selection signal latency time, the internal data strobe signal latency time, the external data strobe signal latency time, and the reference clock signal are synchronized is a read latency time, and a time length of the read latency time ranges between one time of the length of the time cycle plus 30 nanoseconds (ns) and one time of the length of the time cycle plus 34 ns.

Preferably, according to the signal synchronization adjustment method of the present invention, if the dynamic random access memory is in the low frequency mode, the signal synchronization adjustment method includes the following steps: a first low frequency delaying step that the dynamic random access memory delays for a first low frequency latency time according to the first rising edge of the reference clock signal after the third command is generated; a first low frequency triggering step that the dynamic random access memory synchronously triggers the column selection signal according to a second rising edge of the reference clock signal after the first low frequency latency time; a second low frequency delaying step that the dynamic random access memory delays for a second low frequency latency time according to the second rising edge of the reference clock signal after the first low frequency latency time; a second low frequency triggering step that the dynamic random access memory triggers the internal data strobe signal.

Preferably, according to the signal synchronization adjustment method of the present invention, a time difference between a time when the dynamic random access memory triggers the column selection signal and a time when the dynamic random access memory triggers the internal data strobe signal is the second low frequency latency time.

Preferably, according to the signal synchronization adjustment method of the present invention, if the dynamic random access memory is in the high frequency mode, the signal synchronization adjustment method includes the following steps: a first high frequency delaying step that the dynamic random access memory delays for a first high frequency latency time according to the first rising edge of the reference clock signal after the third command is generated; a first high frequency triggering step that the dynamic random access memory triggers the column selection signal; a second high frequency delaying step that the dynamic random access memory further delays for a second high frequency latency time; a second high frequency triggering step that the dynamic random access memory synchronously triggers the internal data strobe signal according to a third rising edge of the reference clock signal after the first high frequency latency time and the second high frequency latency time.

Preferably, according to the signal synchronization adjustment method of the present invention, a time difference between a time when the dynamic random access memory triggers the column selection signal and a time when the dynamic random access memory triggers the internal data strobe signal is a sum of time that the second high frequency latency time and the reference clock signal are synchronized.

Also, in order to achieve the above object, the present invention, based on the above-mentioned signal synchronization adjustment method, further provides a signal synchronization adjustment circuit, for applying to the signal synchronization adjustment method described in claim 1, the signal synchronization adjustment circuit comprising: an input circuit, which receives a chip selection signal, the command signal and the reference clock signal, and generates an input signal, wherein the command signal responses to the chip selection signal; an internal data strobe signal delay circuit, which is coupled to the input circuit, the internal data strobe signal delay circuit receives the reference clock signal and the input signal and delays for a read latency time, and then generates the internal data strobe signal synchronized with the reference clock signal; an external data strobe signal delay circuit, which is coupled to the internal data strobe signal delay circuit, the external data strobe signal delay circuit delays for an external data strobe signal latency time and generates the external data strobe signal, after receiving the internal data strobe signal, and the external data strobe signal delay circuit transmits the external data strobe signal to the memory controller.

Preferably, according to the signal synchronization adjustment circuit of the present invention, when the dynamic random access memory is in the low frequency mode, the signal synchronization adjustment circuit comprises: a first low frequency delay circuit, which is coupled to the input circuit, the first low frequency delay circuit is used for delaying for a first low frequency latency time after receiving the third command of the command signal; a low frequency synchronous delay circuit, which is coupled to the first low frequency delay circuit, the low frequency synchronous delay circuit receives the reference clock signal, and after delaying for the first low frequency latency time, the low frequency synchronous delay circuit generates a temporary internal data strobe signal by synchronizing with the reference clock signal; a second low frequency delay circuit, which is coupled to the low frequency synchronous delay circuit, the second low frequency delay circuit receives the temporary internal data strobe signal and delays for a second low frequency latency time, so as to generate the internal data strobe signal synchronized with the reference clock signal.

Preferably, according to the signal synchronization adjustment circuit of the present invention, when the dynamic random access memory is in the high frequency mode, the signal synchronization adjustment circuit comprises: a first high frequency delay circuit, which is coupled to the input circuit, the first high frequency delay circuit is used for delaying for a first high frequency latency time after receiving the third command of the command signal; a second high frequency delay circuit, which is coupled to the first high frequency delay circuit, the second high frequency delay circuit is used for delaying for a second high frequency latency time; a high frequency synchronous delay circuit, which is coupled to the second high frequency delay circuit, the high frequency synchronous delay circuit receives the reference clock signal, and after delaying for the second high frequency latency time, the high frequency synchronous delay circuit generates the internal data strobe signal by synchronizing with a the reference clock signal.

In summary, according to the signal synchronization adjustment method and the signal synchronization adjustment circuit provided in the present invention, in the signal synchronization adjustment method, the dynamic random access memory is used to delay for a column selection signal latency time according to a first rising edge of the reference clock signal, and then trigger the column selection signal; in addition, after delaying for the column selection signal latency time, the dynamic random access memory further delays for an internal data strobe signal latency time and triggers an internal data strobe signal; such that the column selection signal and the internal data strobe signal are synchronized with the reference clock signal at various frequencies, thereby the dynamic random access memory can stably execute the read operation by the synchronized column selection signal and internal data strobe signal at various frequencies.

In order to make those skilled in the art understand the purpose, features and effects of the present invention, the present invention is described in detail as follows by means of the following specific embodiments in conjunction with the accompanying drawings.

DETAILED DESCRIPTION OF THE PREFERRED EMBODIMENT

Figure 1:
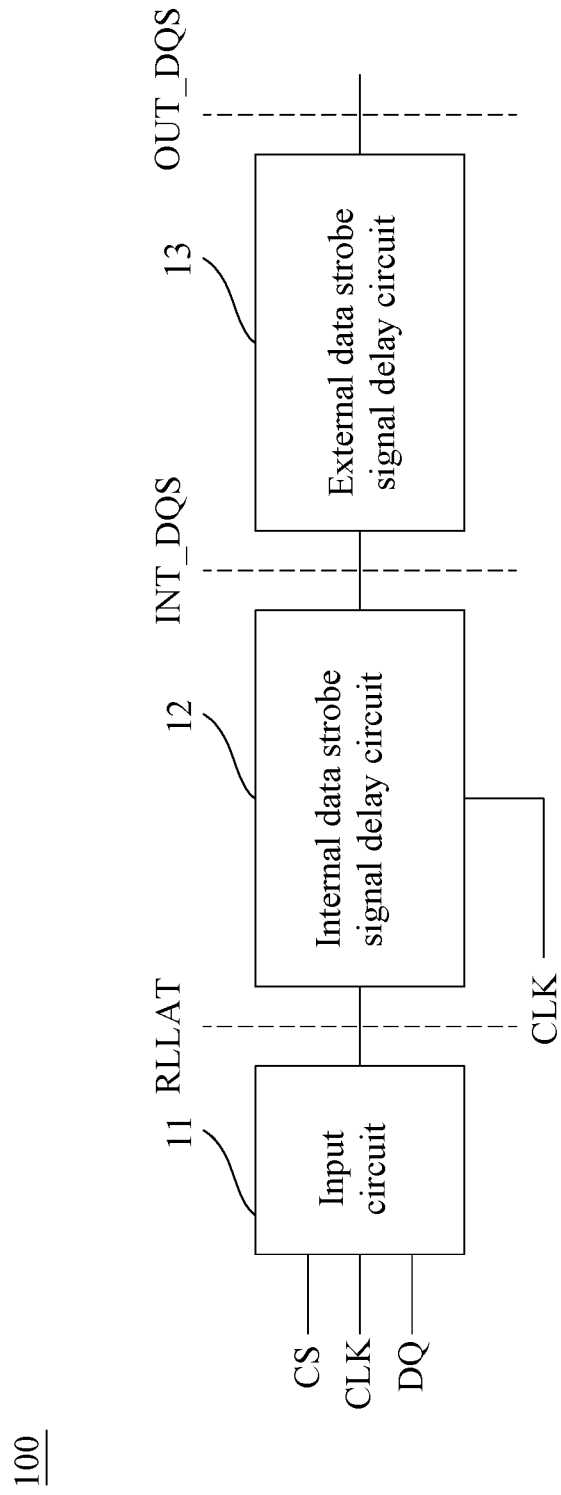
FIG. 1 is a schematic circuit block diagram of a signal synchronization adjustment circuit according to the present invention.

The inventive concept will now be more sufficiently explained hereinafter with reference to the accompanying drawings in which exemplary embodiments of the inventive concept are shown. The advantages and features of the inventive concept, as well as methods for achieving the same, will become apparent from the following exemplary embodiments set forth in more detail with reference to the accompanying drawings. However, it should be noted that the inventive concept is not limited to the following exemplary embodiments, and may be implemented in various forms. Therefore, the exemplary embodiments are provided merely to disclose the inventive concept and to clarify the inventive concept to those skilled in the art. In the drawings, the exemplary embodiments of the inventive concept are not limited to the specific examples provided herein and are exaggerated for clarity.

The terminology used herein is only used to describe particular embodiments, and is not intended to limit the present invention. As used herein, the singular terms "a(an)" and "the" are intended to include the plural forms as well, unless otherwise dictated in the context clearly. As used herein, the term "and/or" includes any and all combinations of one or more of the associated listed items. It will be understood that when an element is referred to as being "connected" or "coupled" to another element, it can be directly connected or coupled to the other element or intervening elements may be present.

Similarly, it will be understood that when an element (e.g., a layer, region, or substrate) is referred to as being "on" another element, it can be directly on the other element or intervening elements may be present. In contrast, the term "directly" means that there are no intervening elements. It should be further understood that when the terms "comprises/comprising", "includes and/or including" are used herein, they are intended to indicate the presence of the stated features, integers, steps, operations, elements, and/or components, but does not preclude the presence or addition of one or more other features, integers, steps, operations, elements, components, and/or the groups thereof.

Furthermore, exemplary embodiments in the detailed description are illustrated by cross-sectional views being idealized exemplary drawings of the inventive concepts. Accordingly, the shapes shown in the exemplary drawings may be modified according to manufacturing techniques and/or tolerances. Thus, exemplary embodiments of the inventive concept are not limited to the specific shapes shown in the exemplary drawings, but may include other shapes that may be produced according to manufacturing processes. The regions illustrated in the drawings have general characteristics and are used to illustrate specific shapes of elements. Therefore, this should not be construed as limiting the scope of the inventive concept.

It will also be understood that, although the terms "first", "second", "third", etc. may be used herein to describe various elements, these elements should not be limited by these terms. These terms are only used to distinguish each element. Thus, a first element in some embodiments could be termed a second element in other embodiments without departing from the teachings of the present invention. Exemplary embodiments of aspects of the inventive concepts illustrated and described herein include their complementary counterparts. Throughout this specification, the same reference numerals or the same designators refer to the same elements.

Furthermore, exemplary embodiments are described herein with reference to cross-sectional and/or plan views, which are idealized exemplary drawings for illustrations. Accordingly, deviations from the shapes shown in the drawings, for example, caused by manufacturing techniques and/or tolerances, are expected to be presented. Accordingly, the exemplary embodiments should not be limited to the shapes of the regions illustrated herein, but are intended to include deviations in shapes, for example, caused by manufacturing. For example, an etched region drawn in a rectangle shape will typically have rounded or curved features. Thus, the regions illustrated in the drawings are schematic and their shapes are not intended to illustrate the actual shape of the regions of a device and are not intended to limit the scope of example embodiments, either.

As understood by the inventors (inventive entity), devices and methods for forming the devices according to various exemplary embodiments described herein may be implemented in microelectronic devices, such as integrated circuits, wherein a plurality of devices according to various exemplary embodiments described herein are integrated into the same microelectronic device. Accordingly, the cross-sectional views illustrated herein can be reproduced in the microelectronic device in two different directions, which need not be orthogonal. Accordingly, a plan view of the microelectronic device implementing devices according to various exemplary embodiments described herein may include a plurality of devices in an array and/or a two-dimensional arrangement based on the functionality of the microelectronic device.

Accordingly, the cross-sectional views illustrated herein provide support for a plurality of devices according to various exemplary embodiments described herein, the plurality of devices extend along two different directions in planar view and/or extend along three different directions in perspective view.

Figure 2:
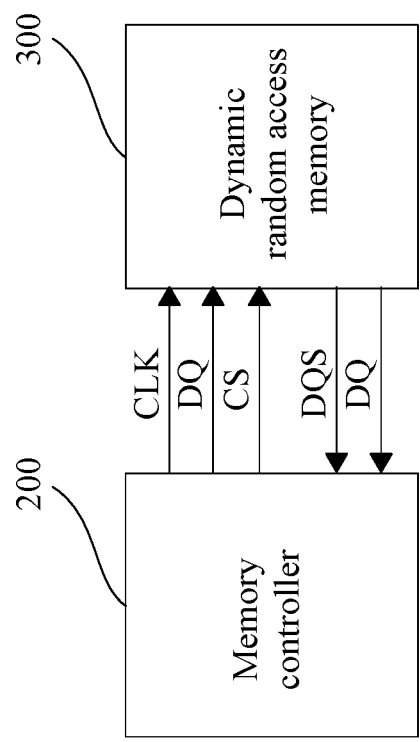
FIG. 2 is a schematic diagram illustrating the configuration of a signal synchronization adjustment circuit according to the present invention.
Figure 3:
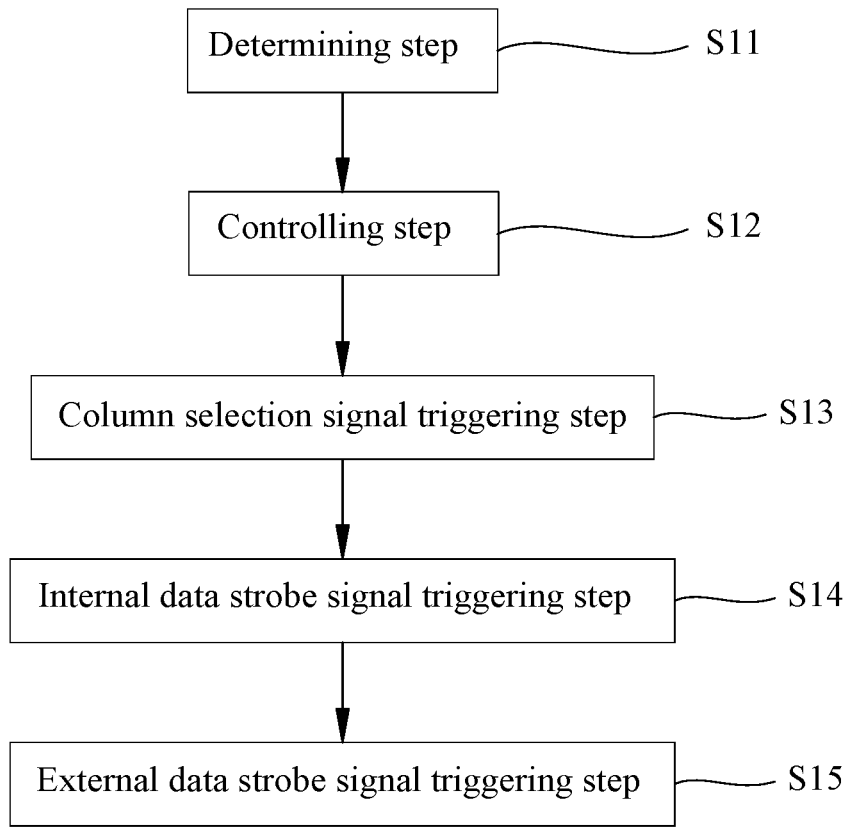
FIG. 3 is a block diagram illustrating the steps of executing the signal synchronization adjustment method of the present invention.
Figure 4:
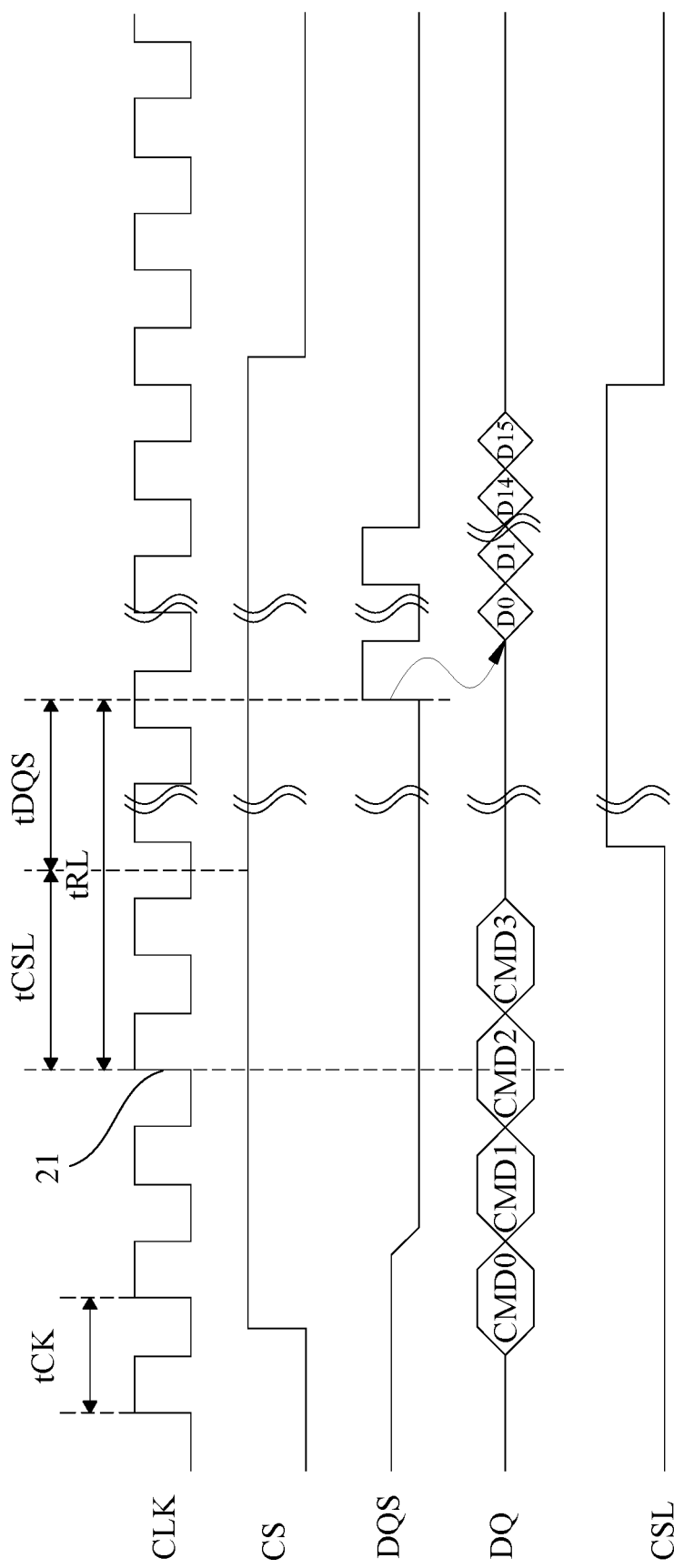
FIG. 4 is a clock diagram illustrating the actual execution process of the method for generating dynamic image according to the present invention.

Please refer to FIGS. 1-4, wherein FIG. 1 is a schematic circuit block diagram of a signal synchronization adjustment circuit according to the present invention; FIG. 2 is a schematic diagram illustrating the configuration of a signal synchronization adjustment circuit according to the present invention; FIG. 3 is a block diagram illustrating the steps of executing the signal synchronization adjustment method of the present invention; FIG. 4 is a clock diagram illustrating the actual execution process of the method for generating dynamic image according to the present invention. As shown in FIG. 1, a signal synchronization adjustment circuit 100 according to the present invention includes: an input circuit 11, an internal data strobe signal delay circuit 12 and an external data strobe signal delay circuit 13.

Specifically, please refer to FIG. 2, the signal synchronization adjustment circuit 100 of the present invention is for applying to data reading according to a reference clock signal CLK between a memory controller 200 and a dynamic random access memory 300 in an electronic device. As shown in FIG. 2, in some embodiments, when writing data, the memory controller 200 may transmit a reference clock signal CLK, a command signal DQ, and chip selection signal CS to the dynamic random access memory 300. When reading data, the command signal DQ and the data strobe signal DQS will be sent back to the memory controller 200 through the dynamic random access memory 300 together with the corresponding data, such that the control chip can access the data in the dynamic random access memory 300 according to the triggering of the data strobe signal DQS.

Specifically, please refer to FIGS. 1-4, the input circuit 11 according to the present invention is used to receive the chip selection signal CS, the command signal DQ and the reference clock signal CLK, and trigger an input signal RLLAT inside the dynamic random access memory 300, wherein the command signal DQ responses to the chip selection signal CS. In some embodiments, one of the chip selection signal CS and the data strobe signal DQS can be selected as the indicator signal. The memory controller 200 can inform the dynamic random access memory 300 to receive the read data. More specifically, the command signal DQ may include a first command CMD0, a second command CMD1, a third command CMD2 and a fourth command CMD3, and the memory controller 200 may transmit the command signals CMD, an address signal ADDR (not shown), an clock enable signal CKE (not shown), the command signal DQ, etc. to the dynamic random access memory 300. It should be further explained that, in some embodiments, the first command CMD0 is a command signal CMD for providing the read command, the second command CMD1 is for providing the row address, the third command CMD2 is for providing the column address; since the command signals of the dynamic random access memory are well known for those skilled in the art, they will not be repeatedly described.

Specifically, please refer to FIG. 1-4, the internal data strobe signal delay circuit 12 according to the present invention is coupled to the input circuit 11. The internal data strobe signal delay circuit 12 receives the command signal DQ and the reference clock signal CLK, and delays for a column selection signal latency time tCSL and an internal data strobe signal latency time tDQS, and then generates the internal data strobe signal INT_DQS synchronized (synchronization, Sync) with the reference clock signal CLK.

Specifically, please refer to FIGS. 1-4, the external data strobe signal delay circuit 13 according to the present invention is coupled to the internal data strobe signal delay circuit 12. The external data strobe signal delay circuit 13 delays for an external data strobe signal latency time T3 and generates an external data strobe signal OUT_DQS after receiving the internal data strobe signal INT_DQS, and the external data strobe signal delay circuit 13 transmits the external data strobe signal OUT_DQS to the memory controller 200.

It should be further noted that, in some embodiments, the cycle of the clock signal CLK is equal to the cycle of the internal data strobe signal INT_DQS, and the cycle of the clock signal CLK and the cycle of the internal data strobe signal INT_DQS are both one time cycle tCK, but the present invention is not limited thereto.

Specifically, according to the above structure, in some embodiments, the internal data strobe signal delay circuit 12 and the external data strobe signal delay circuit 13 may be generated and implemented by using serially connected logic gate(s) (e.g., a NAND gate(s)) and inverter(s), but the present invention is not limited thereto. Therefore, since both the internal data strobe signal delay circuit 12 and the external data strobe signal delay circuit 13 of the present invention are only composed of inverter(s) and resistor(s), the power consumption can be greatly reduced, the space occupied by the delay circuits can be reduced at the same time, and effects such as low power consumption and wide applicability can be achieved.

In order to further understand the structural features, the technical means applied and the expected effects of the present invention, the used method of the present invention will be described, and it is believed that a more in-depth and specific understanding of the present invention can be obtained from this. Please refer to FIGS. 3-4, a signal synchronization adjustment method according to the present invention includes the following steps S11-S15:

In a determining step S11, the memory controller 200 determines the dynamic random access memory 300 being in one of a low frequency mode and a high frequency mode according to the reference clock signal CLK. Then a controlling step S12 is performed.

In the controlling step S12, the memory controller 200 triggers the command signal DQ to the dynamic random access memory 300, the command signal DQ includes a first command CMD0, a second command CMD1, a third command CMD2 and a fourth command CMD3. Then a column selection signal triggering step S13 is performed.

In the column selection signal triggering step S13, after the third command CMD2 is generated, the dynamic random access memory 300 delays for a column selection signal latency time tCSL according to a first rising edge 21 of the reference clock signal CLK, and then triggers a column selection signal CSL. Then an internal data strobe signal triggering step S14 is performed.

In the internal data strobe signal triggering step S14, the dynamic random access memory 300 delays for an internal data strobe signal latency time tDQS, and then triggers the internal data strobe signal INT_DQS. Then an external data strobe signal triggering step S15 is performed.

In the external data strobe signal triggering step S15, the dynamic random access memory 300 delays for an external data strobe signal latency time T3, and then triggers the external data strobe signal OUT_DQS.

It should be further noted that, in some embodiments, when the dynamic random access memory 300 is in the low frequency mode, the time length of a first column selection data 31 of the column selection signal CSL is four times of a length of the time cycle tCK, and when the dynamic random access memory 300 is in the high frequency mode, the time length of the first column selection data 31 of the column selection signal CSL ranges between three and four times of the length of the time cycle tCK. It is because that the delay circuits of the present invention are composed of inverter(s) and resistor(s), the column selection signal latency time tCSL is relatively long. When the dynamic random access memory 300 is in the low frequency mode, the trigger latency time of the dynamic random access memory 300 is less than the time cycle tCK, therefore, the time cycle of the column selection signal CSL can be synchronized with the time cycle tCK, such that the dynamic random access memory 300 can directly trigger the column selection signal CSL synchronized with the reference clock signal CLK in the column selection signal triggering step S13. On the contrary, when the dynamic random access memory 300 is in the high frequency mode, since the trigger latency time of the dynamic random access memory 300 may be greater than the time cycle tCK, the column selection signal CSL directly triggered in the column selection signal triggering step S13 cannot be synchronized with the reference clock signal CLK, but must be corrected by the reference clock signal CLK, thereby in the high frequency mode, the time length of the first column selection data 31 of the low selection signal CSL ranges between three and four times of the length of the time cycle tCK, but the present invention is not limited thereto.

It is worth mentioning that, in some embodiments, when the dynamic random access memory 300 is in the high frequency mode, the frequency of the reference clock signal CLK may be a frequency greater than 100 Mhz, such as 1066 Mhz and 625 Mhz, etc. In other embodiments, when the dynamic random access memory 300 is in the low frequency mode, the frequency of the reference clock signal CLK may be a frequency less than 100 Mhz, such as 10 Mhz and 20 Mhz, etc., but the present invention is not limited thereto.

It is worth further mentioning that, in some embodiments, the sum of time that the column selection signal latency time tCSL, the internal data strobe signal latency time tDQS, the external data strobe signal latency time T3 and the reference clock signal CLK are synchronized can be defined as a read latency time tRL, and the time length of the read latency time tRL may ranges between one time of the length of the time cycle tCK plus 30 nanoseconds (ns) and one time of the length of the time cycle tCK plus 34 ns, but the present invention is not limited thereto.

In order to further understand the structural features, the technical means applied and the expected effects of the present invention, the actual execution process of the present invention will be described, and it is believed that a more in-depth and specific understanding of the present invention can be obtained from this, as follows:

Please refer to FIG. 4 in conjunction with FIGS. 1-3, the actual execution process of the signal synchronization adjustment circuit 100 according to the present invention is described as follows. First, the determining step S11 is performed, wherein the memory controller 200 determines the dynamic random access memory 300 being in the low frequency mode or the high frequency mode according to the reference clock signal CLK. Then, the controlling step S12 is performed, wherein the memory controller 200 triggers the command signal DQ to the dynamic random access memory 300 through the input circuit 11, and the command signal DQ includes the first command CMD0, the second command CMD1, the third command CMD2 and the fourth command CMD3, and the memory controller 200 stops controlling the dynamic random access memory 300. After that, the column selection signal triggering step S13 is performed, wherein after the third command CMD2 is generated, the dynamic random access memory 300 delays for a column selection signal latency time tCSL according to the first rising edge 21 of the reference clock signal CLK through the internal data strobe signal delay circuit 12, and then triggers the column selection signal CSL. Then, the internal data strobe signal triggering step S14 is performed, wherein the dynamic random access memory 300 delays for an internal data strobe signal latency time tDQS through the internal data strobe signal delay circuit 12, and then triggers the internal data strobe signal INT_DQS. Finally, the external data strobe signal triggering step S15 is performed, wherein the dynamic random access memory 300 delays for an external data strobe signal latency time T3 through the external data strobe signal delay circuit 13, and then triggers the external data strobe signal OUT_DQS.

Therefore, according to the signal synchronization adjustment circuit 100 of the present invention in conjunction with the above-mentioned signal synchronization adjustment method, the dynamic random access memory 300 is used to delay for a column selection signal latency time tCSL according to a first rising edge 21A of the reference clock signal CLK, and then trigger the column selection signal CSL; after delaying for the column selection signal latency time tCSL, the dynamic random access memory 300 further delays for an internal data strobe signal latency time tDQS and triggers an internal data strobe signal INT_DQS; such that the column selection signal CSL and the internal data strobe signal INT_DQS are synchronized with the reference clock signal CLK, thereby the dynamic random access memory 300 can stably execute the read operation by the synchronized column selection signal CSL and internal data strobe signal INT_DQS.

Hereinafter, the first embodiment of the signal synchronization adjustment circuit 100 of the present invention will be described with reference to the drawings, so that those skilled in the art may more clearly understand possible variations. Elements designated with the same reference numerals as illustrated above are substantially the same as those described above with reference to FIG. 1. The elements, features, and advantages same as the signal synchronization adjustment circuit 100 will not be repeatedly described.

Figure 5:
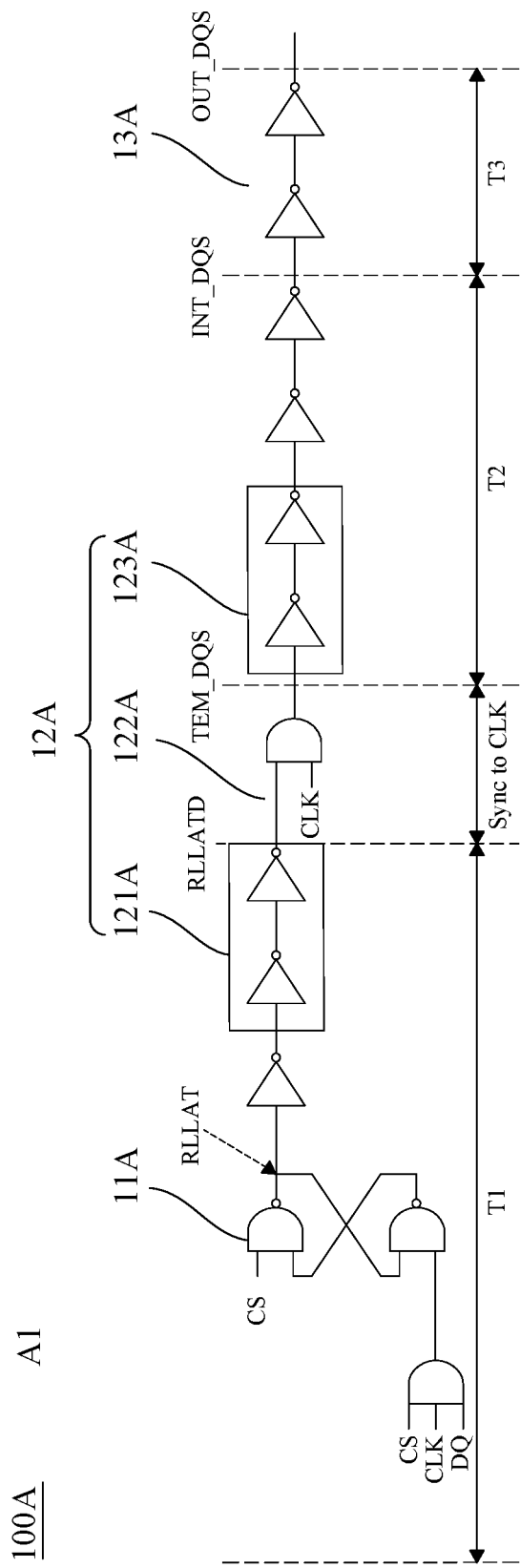
FIG. 5 is a schematic diagram of a signal synchronization adjustment circuit according to the first embodiment of the present invention.
Figure 6:
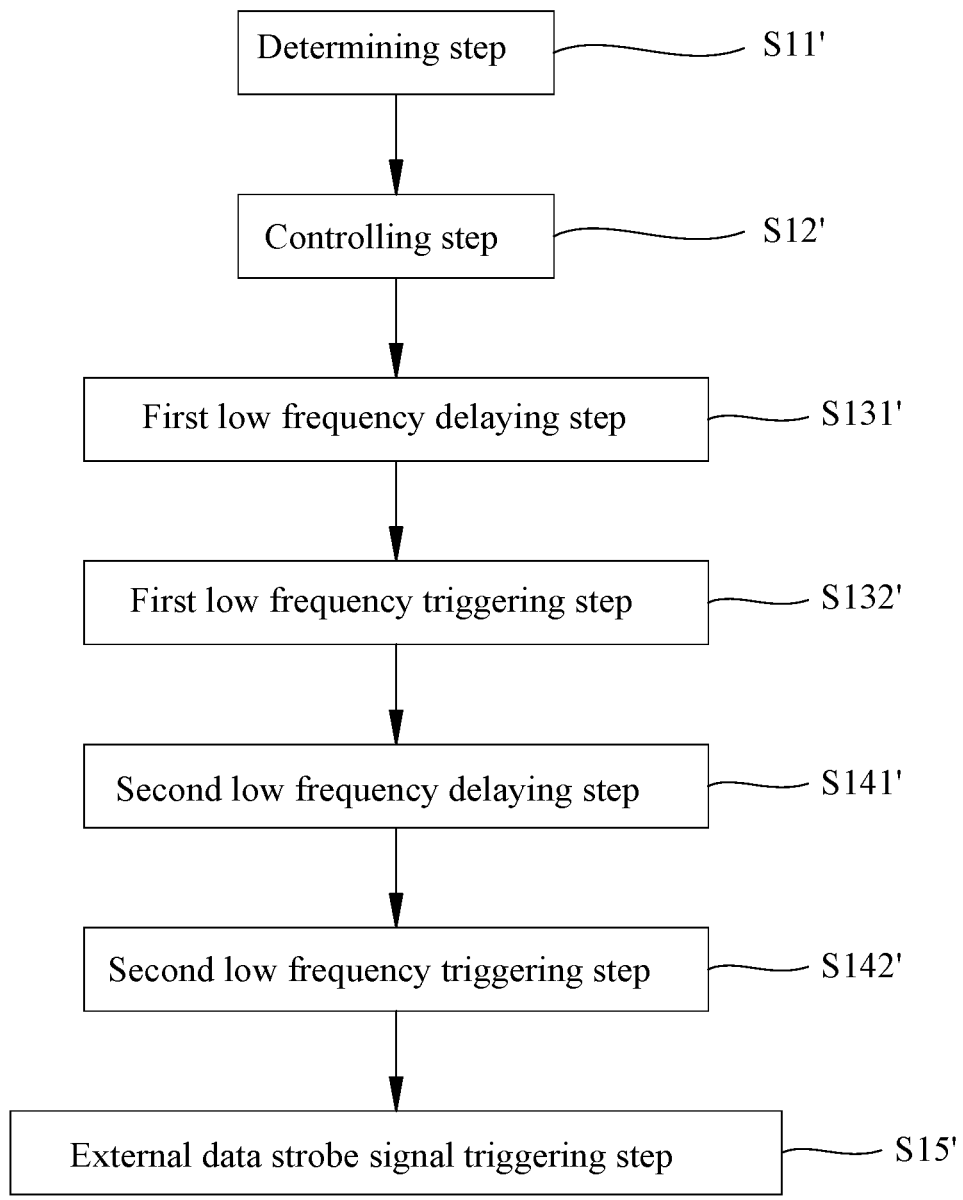
FIG. 6 is a block diagram illustrating the steps of executing the signal synchronization adjustment method according to the first embodiment of the present invention.
Figure 7:
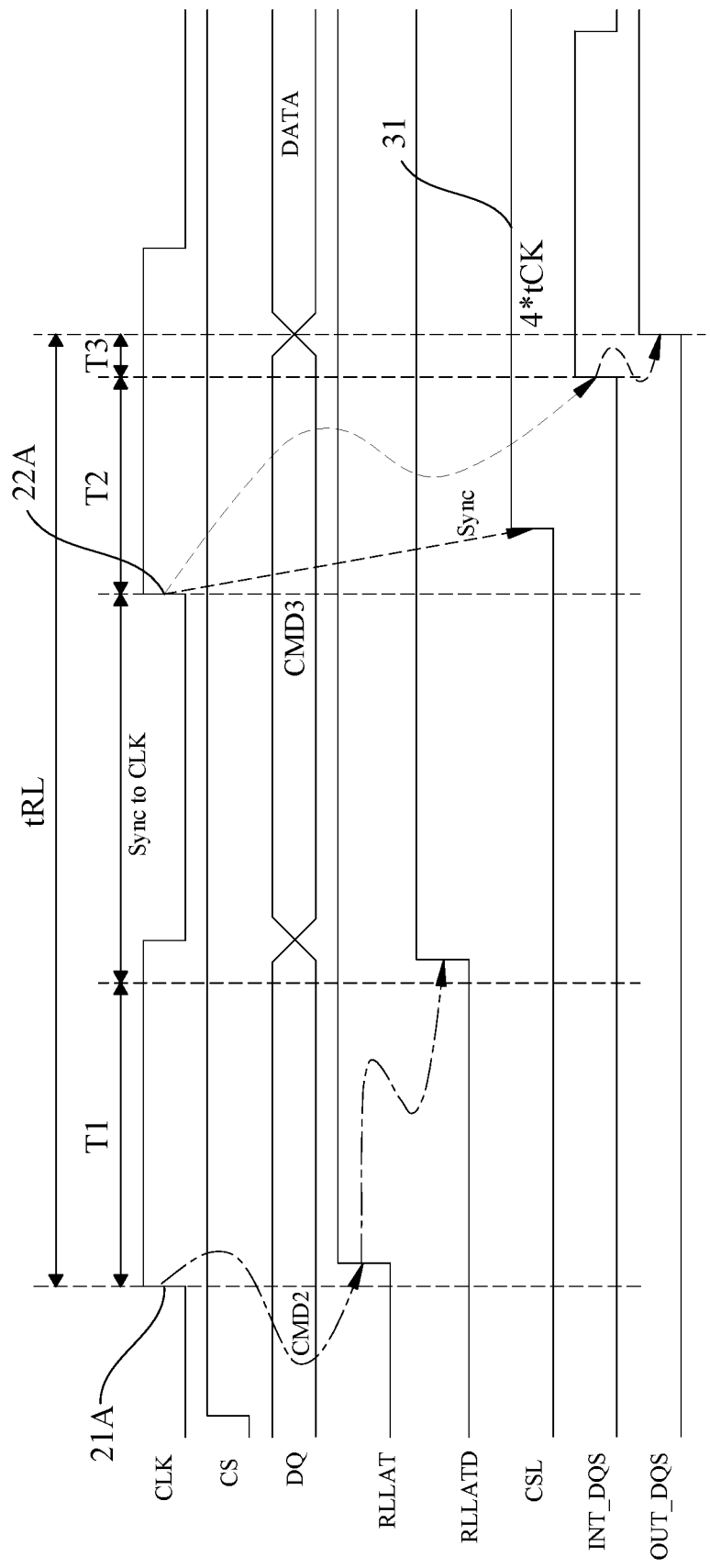
FIG. 7 is a clock diagram illustrating the actual execution process of the method for generating dynamic image according to the first embodiment of the present invention.

Please refer to FIGS. 5-7, wherein FIG. 5 is a schematic diagram of a signal synchronization adjustment circuit according to the first embodiment of the present invention; FIG. 6 is a block diagram illustrating the steps of executing the signal synchronization adjustment method according to the first embodiment of the present invention; FIG. 7 is a clock diagram illustrating the actual execution process of the method for generating dynamic image according to the first embodiment of the present invention. As shown in FIG. 5, when the dynamic random access memory 300 is in the low frequency mode A1, a signal synchronization adjustment circuit 100A according to the first embodiment of the present invention includes: an input circuit 11A, an internal data strobe signal delay circuit 12A and an external data strobe signal delay circuit 13A. The internal data strobe signal delay circuit 12A includes a first low frequency delay circuit 121A, a low frequency synchronous delay circuit 122A and a second low frequency delay circuit 123A.

Specifically, please refer to FIGS. 5-7, the first low frequency delay circuit 121A of the present invention is coupled to the input circuit 11A. After the input circuit 11A receives the third command CMD2 of the command signal DQ, the dynamic random access memory 300 internally triggers the input signal RLLAT, and delays for a first low frequency latency time T1 through the first low frequency delay circuit 121A to generate an delayed input signal RLLATD is used for delaying for a first low frequency latency time T1. In this embodiment, the first low frequency delay circuit 121A is composed of a plurality of inverters in serial connection, but the present invention is not limited thereto.

Specifically, please refer to FIGS. 5-7, the low frequency synchronous delay circuit 122A according to the present invention is coupled to the first low frequency delay circuit 121A. The low frequency synchronous delay circuit 122A receives the reference clock signal CLK, and receives the delayed input signal RLLATD and then is synchronized with the reference clock signal CLK to generate a temporary internal data strobe signal TEM_DQS according to a second rising edge 22A of the reference clock signal CLK, wherein a triggering time difference between the first rising edge 21A and the second rising edge 22A of the reference clock signal CLK is a time that the first low frequency latency time T1 and the reference clock signal CLK are synchronized. In this embodiment, the low frequency synchronous delay circuit 122A is implemented by using logic gate(s) (e.g., NAND gate(s)), but the present invention is not limited thereto.

Specifically, please refer to FIGS. 5-7, the second low frequency delay circuit 123A according to the present invention is coupled to the low frequency synchronous delay circuit 122A. The second low frequency delay circuit 123A receives the temporary internal data strobe signal TEM_DQS and delays for a second low frequency latency time T2, so as to generate the internal data strobe signal INT_DQS synchronized with the reference clock signal CLK. In this embodiment, the second low frequency delay circuit 123A is composed of a plurality of inverters in serial connection, but the present invention is not limited thereto.

In order to further understand the structural features, the technical means applied and the expected effects of the present invention, the used method of the present invention will be described, and it is believed that a more in-depth and specific understanding of the present invention can be obtained from this. Please refer to FIGS. 5-7, the signal synchronization adjustment method according to the first embodiment of the present invention includes the following steps S11'-S15':

In a determining step S11', the memory controller 200 determines the dynamic random access memory 300 being in the low frequency mode A1 according to the reference clock signal CLK. Then a controlling step S12' is performed.

In the controlling step S12', the memory controller 200 triggers the command signal DQ to the dynamic random access memory 300, the command signal DQ includes the first command CMD0, the second command CMD1, the third command CMD2 and the fourth command CMD3. Then a first low frequency delaying step S131' is performed.

In the first low frequency delaying step S131', the dynamic random access memory 300 delays for a first low frequency latency time T1 according to the first rising edge 21A of the reference clock signal CLK after the third command CMD2 is generated. Then a first low frequency triggering step S132' is performed.

In the first low frequency triggering step S132', the dynamic random access memory 300 synchronously triggers the column selection signal CSL according to the second rising edge 22A of the reference clock signal CLK after the first low frequency latency time T1, such that the column selection signal CSL is synchronized with the reference clock signal CLK, wherein a triggering time difference between the first rising edge 21A and the second rising edge 22A of the reference clock signal CLK is a time that the first low frequency latency time T1 and the reference clock signal CLK are synchronized. Then a second low frequency delaying step S141' is performed.

In the second low frequency delaying step S141', the dynamic random access memory 300 delays for a second low frequency latency time T2 according to the second rising edge 22A of the reference clock signal CLK after the first low frequency latency time T1. Then a second low frequency triggering step S142' is performed.

In the second low frequency triggering step S142', the dynamic random access memory 300 triggers the internal data strobe signal INT_DQS. Then an external data strobe signal triggering step S15' is performed.

In the external data strobe signal triggering step S15', the dynamic random access memory 300 delays for an external data strobe signal latency time T3, and then triggers the external data strobe signal OUT_DQS.

It should be further explained that, in this embodiment, since the dynamic random access memory 300 is in the low frequency mode A1, the dynamic random access memory 300 can directly trigger the column selection signal CSL synchronized with the reference clock signal CLK by the first low frequency triggering step S132' after the first low frequency delaying step S131', such that the time length of the first column selection data 31 of the column selection signal CSL can be maintained at four times of the length of the time cycle tCK; in addition, the time difference between the time when the dynamic random access memory 300 triggers the column selection signal CSL and the time when the dynamic random access memory 300 triggers the internal data strobe signal INT_DQS is the second low frequency latency time T2, but the present invention is not limited thereto.

It can be understood that, in this embodiment, the time length of the column selection signal latency time tCSL equals to the difference between the first rising edge 21A and the second rising edge 22A, therefore, the column selection signal latency time tCSL ranges between the first low frequency latency time T1 and the first low frequency latency time T1 plus one time of the length of the time cycle tCK. In addition, in this embodiment, the time length of the internal data strobe signal latency time tDQS is the second low frequency latency time T2, but the present invention is not limited thereto.

In order to further understand the structural features, the technical means applied and the expected effects of the present invention, the actual execution process of the present invention will be described, and it is believed that a more in-depth and specific understanding of the present invention can be obtained from this, as follows:

Please refer to FIG. 7 in conjunction with FIGS. 5 and 6, the actual execution process of the signal synchronization adjustment circuit 100A according to the present invention is described as follows. First, the determining step S11' is performed, wherein the memory controller 200 determines the dynamic random access memory 300 being in the low frequency mode A1 according to the reference clock signal CLK. Then, the controlling step S12' is performed, wherein the memory controller 200 triggers the command signal DQ to the dynamic random access memory 300 through the input circuit 11A, and the command signal DQ includes the first command CMD1, the second command CMD1, the third command CMD2 and the fourth CMD3, and the memory controller 200 stops controlling the dynamic random access memory 300. After that, the first low frequency delaying step S131' is performed, wherein the dynamic random access memory 300 delays for a the first low frequency latency time T1 according to the first rising edge 21A of the reference clock signal CLK through the first low frequency delay circuit 121A after the third command CMD2 is generated. Then, the first low frequency triggering step S132' is performed, wherein the dynamic random access memory 300 synchronously triggers the column selection signal CSL according to the second rising edge 22A of the reference clock signal CLK after the first low frequency latency time T1 through the low frequency synchronous delay circuit 122A, such that the column selection signal CSL is synchronized with the reference clock signal CLK, and the temporary internal data strobe signal TEM_DQS is generated. After that, the second low frequency delaying step S141' is performed, wherein the dynamic random access memory 300 delays for a second low frequency latency time T2 according to the second rising edge 22A of the reference clock signal CLK after the first low frequency latency time T1 through the second low frequency delay circuit 123A. Then, the second low frequency triggering step S142' is performed, wherein the dynamic random access memory 300 triggers the internal data strobe signal INT_DQS. Finally, the external data strobe signal triggering step S15' is performed, wherein the dynamic random access memory 300 delays for an external data strobe signal latency time T3 through the external data strobe signal delay circuit 13A, and then triggers the external data strobe signal OUT_DQS.

Therefore, in this embodiment, the first low frequency delay circuit 121A, the low frequency synchronous delay circuit 122A, and the second low frequency delay circuit 123A can all be generated and implemented by using the serially connected logic gate(s) and inverter(s). Thereby, since the first low frequency delay circuit 121A, the low frequency synchronous delay circuit 122A and the second low frequency delay circuit 123A of the present invention are all only composed of inverter(s) and resistor(s), the power consumption can be greatly reduced, the space occupied by the delay circuits can be reduced at the same time, and effects such as low power consumption and wide applicability can be achieved.

Other examples of the signal synchronization adjustment circuit 100 are provided below so that those skilled in the art may more clearly understand possible variations. Elements designated with the same reference numerals as the embodiments illustrated above are substantially the same as those described above with reference to FIGS. 1-7. The elements, features, and advantages same as the signal synchronization adjustment circuit 100 will not be repeatedly described.

Figure 8:
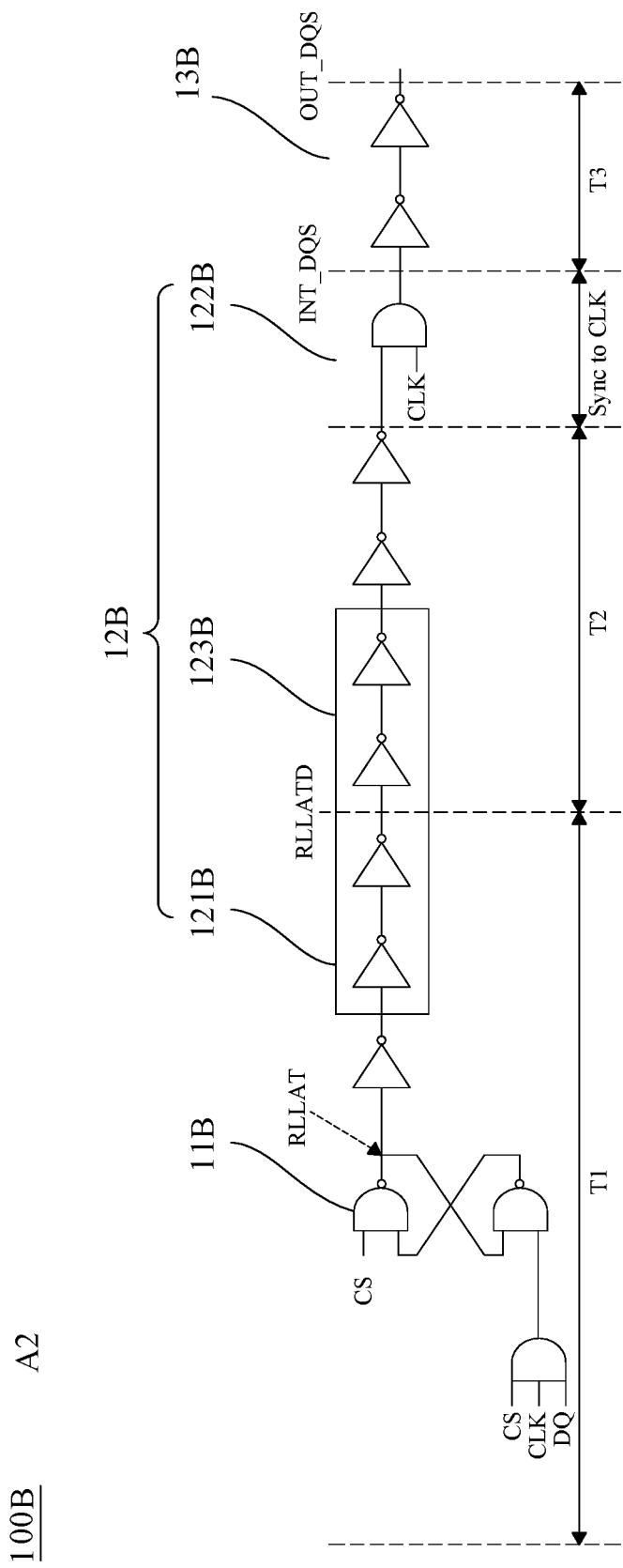
FIG. 8 is a schematic diagram of a signal synchronization adjustment circuit according to a second embodiment of the present invention.
Figure 9:
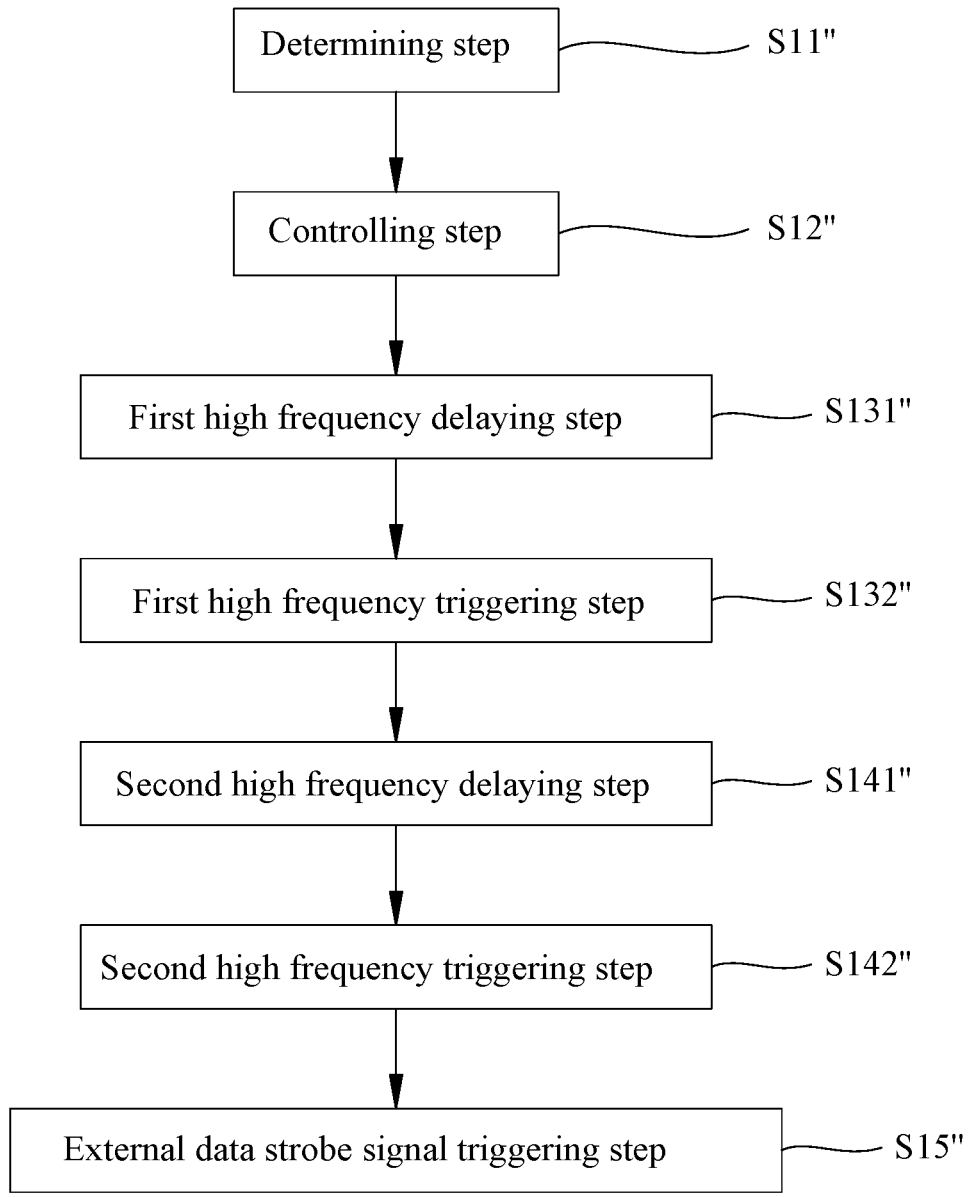
FIG. 9 is a block diagram illustrating the steps of executing the signal synchronization adjustment method according to the second embodiment of the present invention.
Figure 10:
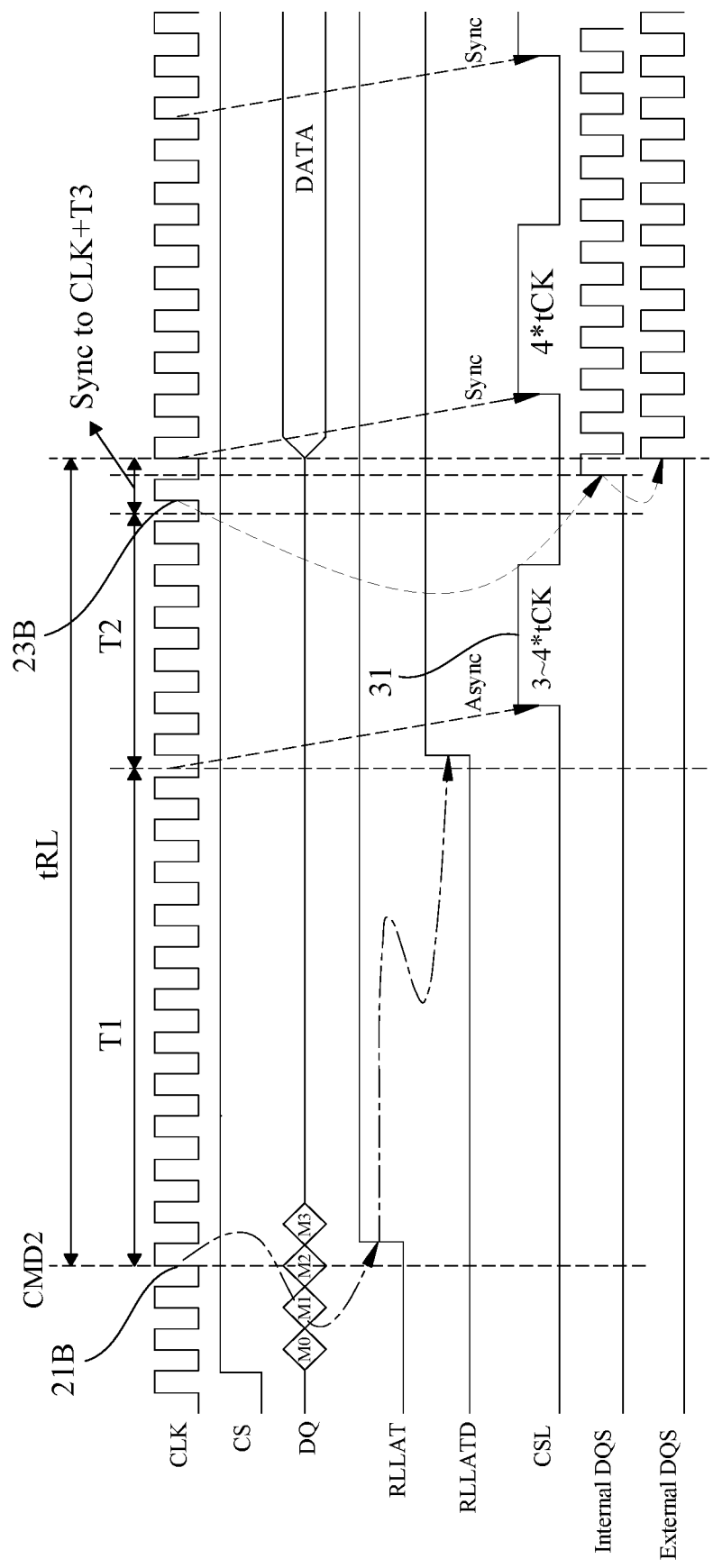
FIG. 10 is a clock diagram illustrating the actual execution process of the method for generating dynamic image according to the second embodiment of the present invention.

Please refer to FIGS. 8-10, wherein FIG. 8 is a schematic diagram of a signal synchronization adjustment circuit according to a second embodiment of the present invention; FIG. 9 is a block diagram illustrating the steps of executing the signal synchronization adjustment method according to the second embodiment of the present invention; FIG. 10 is a clock diagram illustrating the actual execution process of the method for generating dynamic image according to the second embodiment of the present invention. As shown in FIG. 8, when the dynamic random access memory 300 is in the high frequency mode A2, a signal synchronization adjustment circuit 100B according to the second embodiment of the present invention includes: an input circuit 11B, an internal data strobe signal delay circuit 12B and an external data strobe signal delay circuit 13B. The internal data strobe signal delay circuit 12B includes a first high frequency delay circuit 121B, a high frequency synchronous delay circuit 122B and a second high frequency delay circuit 123B.

Specifically, please refer to FIGS. 8-10, the main differences of the signal synchronization adjustment circuit of the second embodiment compared with the first embodiment are that according to the second embodiment of the present invention, the first high frequency delay circuit 121B is coupled to the second high frequency delay circuit 123B, and the second high frequency delay circuit 123B is coupled to the high frequency synchronous delay circuit 122B. It can be understood that, after the input circuit 11B receives the third command CMD2 of the command signal DQ, the dynamic random access memory 300 internally triggers the input signal RLLAT, and delays for a first high frequency latency time T1 through the first high frequency delay circuit 121B to generate a delayed input signal RLLATD, and directly further delays for a second high frequency latency time T2 through the second high frequency delay circuit 123B after generating the delayed input signal RLLATD, such that the time difference between the time when the dynamic random access memory 300 triggers the column selection signal CSL and the time when the dynamic random access memory 300 triggers the internal data strobe signal INT_DQS ranges between the second high frequency latency time T2 and the second high frequency latency time T2 plus one time of the length of the time cycle tCK. It should be further noted that when the dynamic random access memory 300 is in the high frequency mode A2, since the trigger latency time of the dynamic random access memory 300 may be greater than the time cycle tCK, the column selection signal CSL directly triggered by the dynamic random access memory 300 cannot be synchronized with the reference clock signal CLK, and the second high frequency delay circuit 123B must further delay for a second high frequency latency time T2, so as to correct the column selection data 31, which is asynchronous (asynchronous, Async) with the column selection signal CSL, by the reference clock signal CLK, such that the column selection signal CSL and the internal data strobe signal INT_DQS can be achieved to be synchronized with the reference clock signal CLK.

In order to further understand the structural features, the technical means applied and the expected effects of the present invention, the used method of the present invention will be described, and it is believed that a more in-depth and specific understanding of the present invention can be obtained from this. Please refer to FIGS. 8-10, the signal synchronization adjustment method according to the second embodiment of the present invention includes the following steps S11"-S15":

In a determining step S11", the memory controller 200 determines the dynamic random access memory 300 being in the high frequency mode A2 according to the reference clock signal CLK. Then a controlling step S12" is performed.

In the controlling step S12", the memory controller 200 triggers the command signal DQ to the dynamic random access memory 300, the command signal DQ includes the first command CMD0, the second command CMD1, the third command CMD2 and the fourth command CMD3. Then a first high frequency delaying step S131" is performed.

In the first high frequency delaying step S131", the dynamic random access memory 300 delays for a first high frequency latency time T1 according to the first rising edge 21B of the reference clock signal CLK after the third command CMD2 is generated. Then a high frequency triggering step S132" is performed.

In the first high frequency triggering step S132", the dynamic random access memory 300 triggers the column selection signal CSL. Then a second high frequency delaying step S141" is performed.

In the second high frequency delaying step S141", the dynamic random access memory 300 further delays for a second high frequency latency time T2. Then a second high frequency triggering step S142" is performed.

In the second high frequency triggering step S142", the dynamic random access memory 300 synchronously triggers the internal data strobe signal INT_DQS according to a third rising edge 23B of the reference clock signal CLK after the first high frequency latency time T1 and the second high frequency latency time T2, a triggering time difference between the third rising edge 23B and the first rising edge 21B is the first high frequency latency time T1 plus a time that the second high frequency latency time T2 and the reference clock signal CLK are synchronized. Then an external data strobe signal triggering step S15" is performed.

In the external data strobe signal triggering step S15", the dynamic random access memory 300 delays for an external data strobe signal latency time T3, and then triggers the external data strobe signal OUT_DQS.

It should be further explained that, in this embodiment, since the dynamic random access memory 300 is in the high frequency mode A2, the dynamic random access memory 300 must further delay for a second high frequency latency time T2 through the second high frequency delay circuit 123B after delaying for a first high frequency latency time T1, so as to correct the first column selection data 31 of the column selection signal CSL by the reference clock signal CLK, such that the column selection signal CSL and the internal data strobe signal INT_DQS can be achieved to be synchronized with the reference clock signal CLK, thereby the time length of the first column selection data 31 of the column selection signal CSL ranges between three and four times of the length of the time cycle tCK, and the time difference between the time when the dynamic random access memory 300 triggers the column selection signal CSL and the time when the dynamic random access memory 300 triggers the internal data strobe signal INT_DQS is a sum of time that the second high frequency latency time T2 and the reference clock signal CLK are synchronized, but the present invention is not limited thereto.

It can be understood that, in this embodiment, the time length of the column selection signal latency time tCSL is the time length of the first high frequency latency time T1. In addition, in this embodiment, the time length of the internal data strobe signal latency time tDQS ranges between the second high frequency latency time T2 and the second high frequency latency time T2 plus one time of the length of the time cycle tCK, but the present invention is not limited thereto.

In order to further understand the structural features, the technical means applied and the expected effects of the present invention, the actual execution process of the present invention will be described, and it is believed that a more in-depth and specific understanding of the present invention can be obtained from this, as follows:

Please refer to FIG. 10 in conjunction with FIGS. 8 and 9, the actual execution process of the signal synchronization adjustment circuit 100B according to the present invention is described as follows. First, the determining step S11" is performed, wherein the memory controller 200 determines the dynamic random access memory 300 being in the high frequency mode A2 according to the reference clock signal CLK. Then, the controlling step S12" is performed, wherein the memory controller 200 triggers the command signal DQ to the dynamic random access memory 300 through the input circuit 11B, and the command signal DQ includes the first command CMD0, the second command CMD1, the third command CMD2 and the fourth command CMD3. After that, the first high frequency delaying step S131" is performed, wherein the dynamic random access memory 300 delays for a first high frequency latency time T1 according to the first rising edge 21B of the reference clock signal CLK through the first high frequency delay circuit 121B after the third command CMD2 is generated. Then, the first high frequency triggering step S132" is performed, wherein the dynamic random access memory 300 triggers the column selection signal CSL. After that, the second high frequency delaying step S141" is performed, wherein the dynamic random access memory 300 further delays for a second high frequency latency time T2 through the second high frequency delay circuit 123B after delaying for the first high frequency latency time T1. Then, the second high frequency triggering step S142" is performed, wherein the dynamic random access memory 300 synchronously triggers the internal data strobe signal INT_DQS according to the third rising edge 23B of the reference clock signal CLK after the first high frequency latency time T1 and the second high frequency latency time T2 through the high frequency synchronous delay circuit 122B. Finally, the external data strobe signal triggering step S15" is performed, wherein the dynamic random access memory 300 delays for an external data strobe signal latency time T3 through the external data strobe signal delay circuit 13B, and then triggers the external data strobe signal OUT_DQS.

Figure 11:
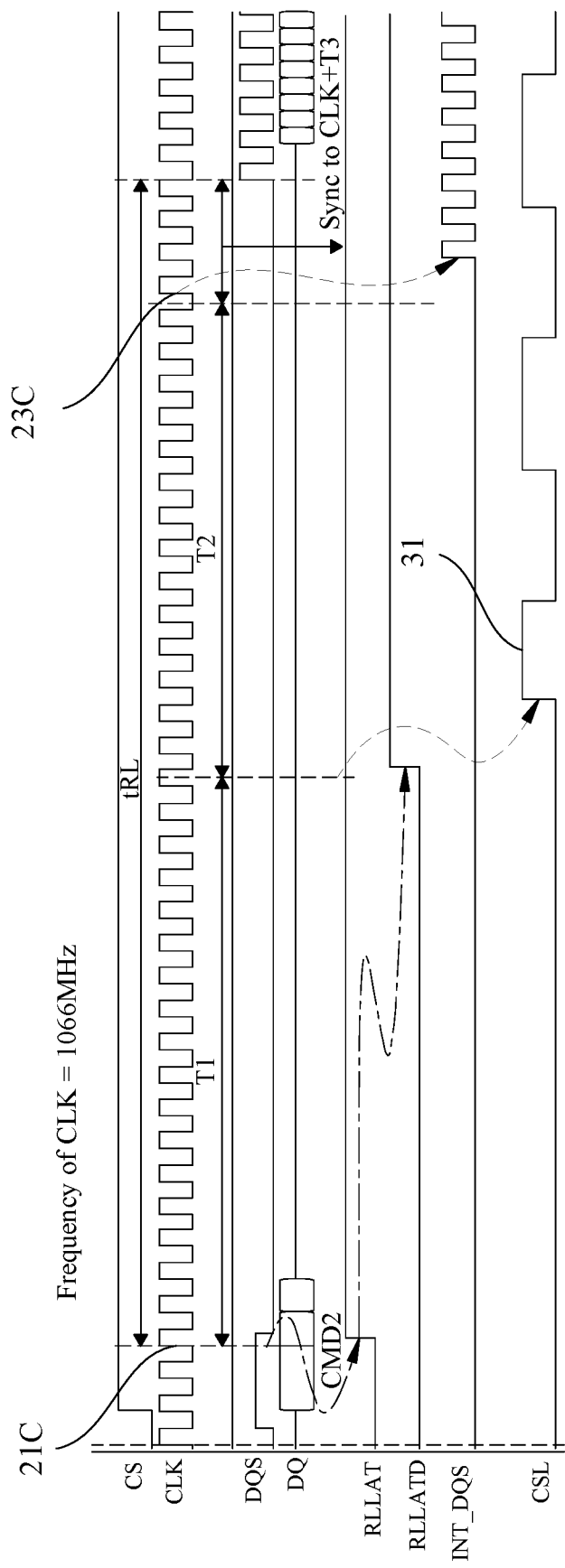
FIG. 11 is a clock diagram illustrating the actual execution process of the method for generating dynamic image according to the third embodiment of the present invention.

Please refer to FIG. 11, which is a clock diagram illustrating the actual execution process of the method for generating dynamic image according to the third embodiment of the present invention. When the frequency of the reference clock signal CLK is 1066 Mhz, the dynamic random access memory 300 according to the present invention can determine the dynamic random access memory 300 being in the high frequency mode according to the reference clock signal CLK; in addition, after a first rising edge 21C, the memory controller 200 delays for a first high frequency latency time T1, and then further delays for a second high frequency latency time T2, so as to correct the first column selection data 31 of the column selection signal CSL by the reference clock signal CLK, and simultaneously trigger the internal data strobe signal INT_DQS according to the third rising edge 23C of the reference clock signal CLK, such that the column selection signal CSL and the internal data strobe signal INT_DQS can be achieved to be synchronized with the reference clock signal CLK.

Figure 12:
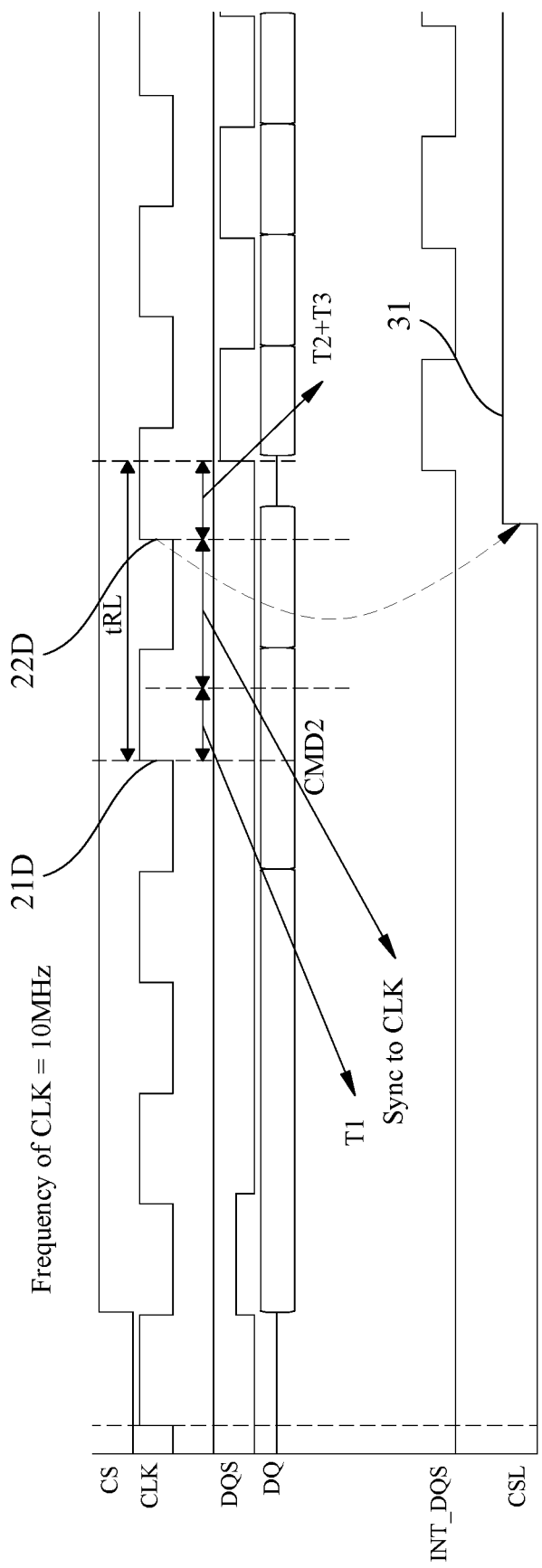
FIG. 12 is a clock diagram illustrating the actual execution process of the method for generating dynamic image according to the fourth embodiment of the present invention.

Please refer to FIG. 12, which is a clock diagram illustrating the actual execution process of the method for generating dynamic image according to the fourth embodiment of the present invention. When the frequency of the reference clock signal CLK is 10 Mhz, the dynamic random access memory 300 according to the present invention can: determine the dynamic random access memory 300 being in the low frequency mode according to the reference clock signal CLK; delay for a first low frequency latency time T1 after the first rising edge 21D; and trigger the column selection signal CSL according to a second rising edge 22D of the reference clock signal CLK, such that the column selection signal CSL is synchronized with the reference clock signal CLK; and trigger the internal data strobe signal INT_DQS by delaying for a second low frequency latency time T2, such that the column selection signal CSL and the internal data strobe signal INT_DQS can be achieved to be synchronized with the reference clock signal CLK.

In summary, according to the signal synchronization adjustment circuit of the present invention in conjunction with the signal synchronization adjustment method, the column selection signal and the internal data strobe signal are successfully achieved to be synchronized with the reference clock signal at various frequencies, which ensures that the dynamic random access memory can stably execute the read operation at various frequencies.

The implementations of the present invention are described above through specific embodiments, those skilled in the art can easily understand other advantages and effects of the present invention from the contents disclosed in this specification.

Although the present invention is described with reference to the embodiments depicted in the accompanying drawings, these are merely examples, and it will be understood by those skilled in the art that various changes and modifications may be made thereto. However, these changes and modifications should not depart from the scope of the present invention. Therefore, the scope of the present invention must be limited to the appended claims.

What is claimed is:

1. A signal synchronization adjustment method, for applying to data reading according to a reference clock signal between a memory controller and a dynamic random access memory in an electronic device, wherein a cycle of the reference clock signal is one time cycle, the method comprises:
   a controlling step that the memory controller triggers a command signal to the dynamic random access memory, the command signal includes a first command, a second command, a third command and a fourth command, and the memory controller stops controlling the dynamic random access memory;
   a column selection signal triggering step that after the third command is generated, the dynamic random access memory delays for a column selection signal latency time according to a first rising edge of the reference clock, and then triggers a column selection signal;
   an internal data strobe signal triggering step that the dynamic random access memory delays for an internal data strobe signal latency time, and then triggers an internal data strobe signal;
   an external data strobe signal triggering step that the dynamic random access memory delays for an external data strobe signal latency time, and then triggers an external data strobe signal.

2. The signal synchronization adjustment method according to claim 1, wherein when the dynamic random access memory is in a low frequency mode, a time length of a first column selection data of the column selection signal is four times of a length of the time cycle, and when the dynamic random access memory is in a high frequency mode, the time length of the first column selection data of the column selection signal ranges between three and four times of the length of the time cycle.

3. The signal synchronization adjustment method according to claim 1, wherein a sum of time that the column selection signal latency time, the internal data strobe signal latency time, the external data strobe signal latency time and the reference clock signal are synchronized is a read latency time, and a time length of the read latency time ranges between one time of the length of the time cycle plus 30 nanoseconds (ns) and one time of the length of the time cycle plus 34 ns.

4. The signal synchronization adjustment method according to claim 2, wherein if the dynamic random access memory is in the low frequency mode, the signal synchronization adjustment method includes the following steps:
   a first low frequency delaying step that the dynamic random access memory delays for a first low frequency latency time according to the first rising edge of the reference clock signal after the third command is generated;
   a first low frequency triggering step that the dynamic random access memory synchronously triggers the column selection signal according to a second rising edge of the reference clock signal after the first low frequency latency time;
   a second low frequency delaying step that the dynamic random access memory delays for a second low frequency latency time according to the second rising edge of the reference clock signal after the first low frequency latency time;
   a second low frequency triggering step that the dynamic random access memory triggers the internal data strobe signal.

5. The signal synchronization adjustment method according to claim 4, wherein a time difference between a time when the dynamic random access memory triggers the column selection signal and a time when the dynamic random access memory triggers the internal data strobe signal is the second low frequency latency time.

6. The signal synchronization adjustment method according to claim 2, wherein if the dynamic random access memory is in the high frequency mode, the signal synchronization adjustment method includes the following steps:
   a first high frequency delaying step that the dynamic random access memory delays for a first high frequency latency time according to the first rising edge of the reference clock signal after the third command is generated;
   a first high frequency triggering step that the dynamic random access memory triggers the column selection signal;
   a second high frequency delaying step that the dynamic random access memory further delays for a second high frequency latency time after delaying for the first high frequency latency time;
   a second high frequency triggering step that the dynamic random access memory synchronously triggers the internal data strobe signal according to a third rising edge of the reference clock signal after the first high frequency latency time and the second high frequency latency time.

7. The signal synchronization adjustment method according to claim 6, wherein a time difference between a time when the dynamic random access memory triggers the column selection signal and a time when the dynamic random access memory triggers the internal data strobe signal is a sum of time that the second high frequency latency time and the reference clock signal are synchronized.

8. A signal synchronization adjustment circuit, for applying to the signal synchronization adjustment method according to claim 1, the signal synchronization adjustment circuit comprising:
   an input circuit, which receives a chip selection signal, the command signal and the reference clock signal, and generates an input signal, wherein the command signal responses to the chip selection signal;
   an internal data strobe signal delay circuit, which is coupled to the input circuit, the internal data strobe signal delay circuit receives the reference clock signal and the input signal and delays for a read latency time, and then generates the internal data strobe signal synchronized with the reference clock signal;
   an external data strobe signal delay circuit, which is coupled to the internal data strobe signal delay circuit, the external data strobe signal delay circuit delays for an external data strobe signal latency time, and generates the external data strobe signal, after receiving the internal data strobe signal, and the external data strobe signal delay circuit transmits the external data strobe signal to the memory controller.

9. The signal synchronization adjustment circuit according to claim 8, wherein when the dynamic random access memory is in the low frequency mode, the signal synchronization adjustment circuit comprises:
   a first low frequency delay circuit, which is coupled to the input circuit, the first low frequency delay circuit is used for delaying for a first low frequency latency time after receiving the third command of the command signal;
   a low frequency synchronous delay circuit, which is coupled to the first low frequency delay circuit, the low frequency synchronous delay circuit receives the reference clock signal, and after delaying for the first low frequency latency time, the low frequency synchronous delay circuit generates a temporary internal data strobe signal by synchronizing with the reference clock signal;
   a second low frequency delay circuit, which is coupled to the low frequency synchronous delay circuit, the second low frequency delay circuit receives the temporary internal data strobe signal and delays for a second low frequency latency time, so as to generate the internal data strobe signal synchronized with the reference clock signal.

10. The signal synchronization adjustment circuit according to claim 8, wherein when the dynamic random access memory is in the high frequency mode, the signal synchronization adjustment circuit comprises:
   a first high frequency delay circuit, which is coupled to the input circuit, the first high frequency delay circuit is used for delaying for a first high frequency latency time after receiving the third command of the command signal;
   a second high frequency delay circuit, which is coupled to the first high frequency delay circuit, the second high frequency delay circuit is used for delaying for a second high frequency latency time;
   a high frequency synchronous delay circuit, which is coupled to the second high frequency delay circuit, the high frequency synchronous delay circuit receives the reference clock signal, and after delaying for the second high frequency latency time, the high frequency synchronous delay circuit generates the internal data strobe signal by synchronizing with the reference clock signal.

* * * * *